(12) United States Patent
Katsuragi et al.

(10) Patent No.: US 6,278,222 B1
(45) Date of Patent: Aug. 21, 2001

(54) PIEZOELECTRIC ELEMENT, PIEZOELECTRIC ELEMENT MANUFACTURING METHOD AND ACTUATOR USING PIEZOELECTRIC ELEMENT

(75) Inventors: Hiroji Katsuragi, Izumi; Naoki Matsui, Sakai, both of (JP)

(73) Assignee: Minolta Co., Ltd., Osaka (JP)

( * ) Notice: Subject to any disclaimer, the term of this patent is extended or adjusted under 35 U.S.C. 154(b) by 0 days.

(21) Appl. No.: 09/377,836

(22) Filed: Aug. 20, 1999

(30) Foreign Application Priority Data

Aug. 26, 1998 (JP) .................................................. 10-254642
Dec. 7, 1998 (JP) .................................................. 10-347074

(51) Int. Cl.$^7$ ...................................................... H02N 2/00
(52) U.S. Cl. ...................................... 310/323.17; 310/369
(58) Field of Search ........................ 310/323.01, 323.17, 310/323.18, 328, 369

(56) References Cited

U.S. PATENT DOCUMENTS

| | | | |
|---|---|---|---|
| 4,216,403 | * 8/1980 | Krempl et al. ........................ | 310/328 |
| 4,304,126 | * 12/1981 | Yelke ................................ | 73/119 A |
| 4,874,979 | 10/1989 | Rapp ................................. | 310/328 |
| 4,911,172 | * 3/1990 | Bui et al. .......................... | 128/662.06 |
| 4,918,666 | * 4/1990 | Beauducel et al. ..................... | 367/15 |
| 5,070,882 | * 12/1991 | Bui et al. .......................... | 128/662.06 |
| 5,109,861 | * 5/1992 | Walinsky et al. ................ | 128/662.06 |
| 5,153,859 | 10/1992 | Chatigny et al. ..................... | 367/140 |
| 5,240,004 | * 8/1993 | Walinsky et al. ............... | 128/662.06 |
| 5,559,387 | * 9/1996 | Beurrier ................................ | 310/328 |

FOREIGN PATENT DOCUMENTS

| | | | |
|---|---|---|---|
| 64-25583 | * 1/1989 | (JP) ..................................... | 310/328 |
| 1-223785 | * 10/1999 | (JP) ..................................... | 310/328 |
| 11-299273 | * 10/1999 | (JP) ..................................... | 310/328 |

* cited by examiner

Primary Examiner—Thomas M. Dougherty
(74) Attorney, Agent, or Firm—McDermott, Will & Emery

(57) ABSTRACT

A piezoelectric element comprising a thin sheet piezoelectric element formed of a piezoelectric ceramic having PZT (PbZrO3.PbTiO3) as a main component with electrodes formed on the surfaces thereof, said thin sheet piezoelectric element being wrapped around a shaft to form a cylinder.

14 Claims, 9 Drawing Sheets

Fig. 11
Fig. 12
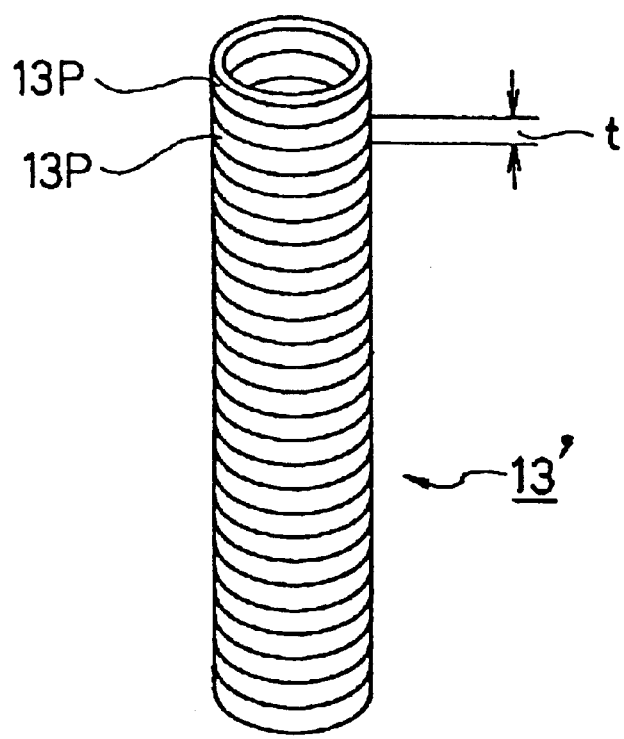
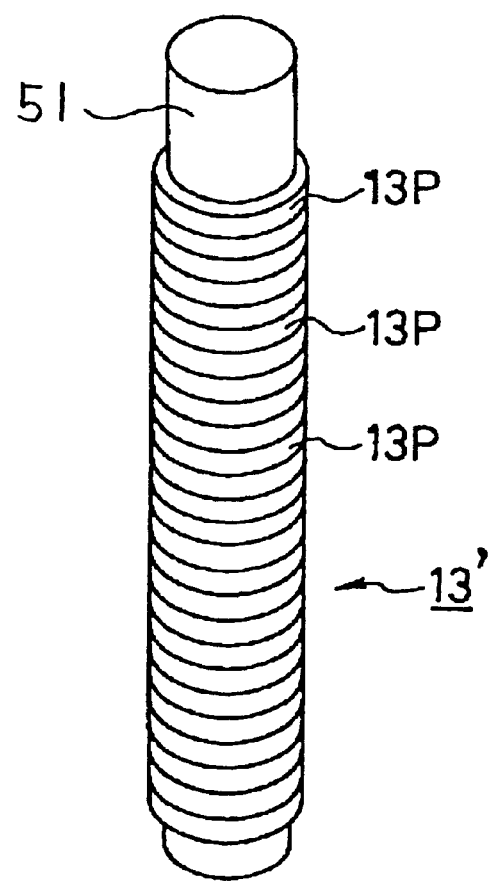

Fig. 14
Fig. 15
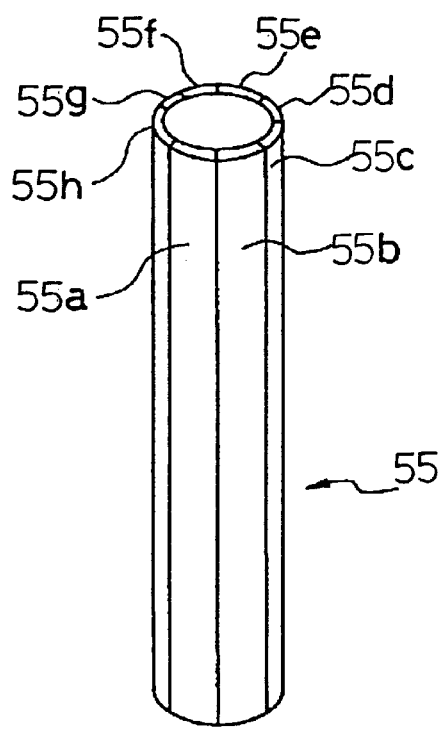
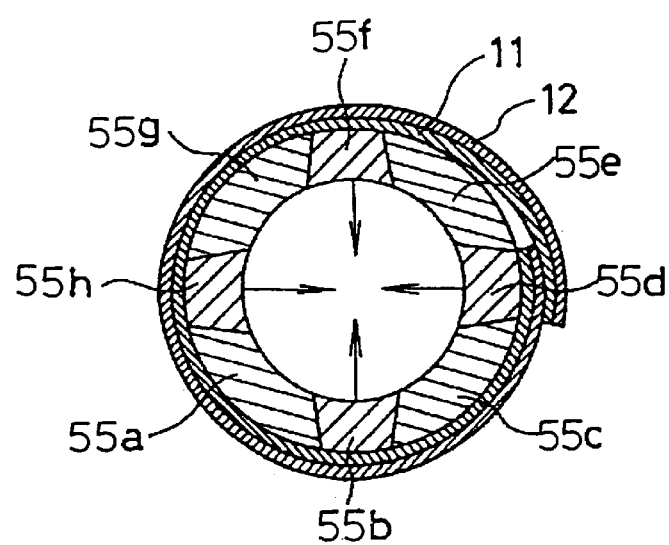

PIEZOELECTRIC ELEMENT, PIEZOELECTRIC ELEMENT MANUFACTURING METHOD AND ACTUATOR USING PIEZOELECTRIC ELEMENT

CROSS-REFERENCE TO RELATED APPLICATIONS

This application is based on patent application Ser. Nos. HEI 10-254642 and HEI 10-347074 filed in Japan, the contents of which are hereby incorporated by reference.

BACKGROUND OF THE INVENTION

1. Field of the Invention

The present invention relates to a piezoelectric element and piezoelectric element manufacturing method and an actuator using a piezoelectric element manufactured by said method.

2. Description of the Related Art

Actuators using a piezoelectric element have been widely used in recent years in cameras, measurement devices, and other precision mechanisms used for positioning and driving driven members because they increase the conversion efficiency for converting the supplied electrical energy to a drive force, increase the generated drive force while reducing the form-factor and weight, and allow the drive force to be easily controlled.

The piezoelectric element used as a power source in such actuators are constructed as units of multilayered piezoelectric elements, as disclosed in U.S. Pat. No. 5,589,723. This construction adds the displacement in the thickness direction generated in the piezoelectric element unit so as to take the largest possible displacement.

The piezoelectric element constructed as a plurality of layers of the piezoelectric element unit is subject to higher cost because it is manufactured by complex operations involving a process for providing electrodes on the respective surfaces of the unit elements, a process for adhering the laminate layers, and a process for connecting the leads of the electrodes of each layer.

A piezoelectric element formed as a single layer of a hollow cylinder has been proposed as another configuration of a piezoelectric element in U.S. Pat. No. , 4,874,979.

The hollow cylinder piezoelectric element characteristically has a relatively high mechanical strength, but requires a higher electric field strength to increase the generated displacement. Accordingly, when there is a restriction on the voltage applied to the piezoelectric element, the electric field intensity must be increased by making the piezoelectric element thinner. This arrangement is disadvantageous in that the strength of the piezoelectric element is reduced when attempting to increase the generated displacement.

For this reason, the present inventors considered constructing a piezoelectric element by forming a ceramic material having PZT (PbZrO3.PbTiO3) as a main component into a thin sheet, attaching electrodes to both surfaces, and wrapping the sheet into a cylindrical shape, then sintering the material.

The element of this construction is subject to disadvantages such as deformation of the piezoelectric element due to the heating process during sintering.

SUMMARY OF THE INVENTION

The present invention eliminates the aforesaid disadvantages by providing an electromechanical transducer or a piezoelectric element comprising a thin sheet piezoelectric element formed of a piezoelectric ceramic having PZT (PbZrO3.PbTiO3) as a main component with electrodes formed on the surfaces thereof, said thin sheet piezoelectric element being wrapped around a shaft to form a cylinder.

This thin sheet piezoelectric element may be constructed by a laminate body comprising laminated first and second piezoelectric elements having an electrode formed on one surface, respectively.

This shaft may be a hollow shaft or solid shaft, and may be a burned shaft formed of the same material as the first and the second piezoelectric elements. The shaft also may be formed by a high melting point material.

This shaft may be constructed by adhering a plurality of members via an adhesive which thermally decomposes at a temperature below the burning temperature of the piezoelectric element.

The plurality of members comprising the shaft may be a plurality of individual disk-shaped plates separated relative to the displacement direction of the piezoelectric element and formed of a high melting point material, this shaft being formed by stacking the plurality of disk-shaped plates in the axial direction and adhering these plates using an adhesive which thermally decomposes at a temperature below the burning temperature of the piezoelectric element so as to form a cylindrical or circular column-like shaft.

The plurality of members comprising the shaft may be a plurality of individual cylindrical or circular column-like segments separated relative to the displacement direction of the piezoelectric element and formed of a high melting point material, this shaft being formed by gluing the plurality of segments using an adhesive which thermally decomposes at a temperature below the burning temperature of the piezoelectric element so as to form a cylindrical or circular column-like shaft.

Alternatively, the shaft may be constructed by coating the surface of a high melting point material with a coating agent which thermally decomposes at a temperature below the burning temperature of the piezoelectric element.

This piezoelectric element is manufactured by a process for forming electrodes on the surface of a first and a second piezoelectric element comprising a piezoelectric ceramic having a thin sheet of PZT (PbZrO3.PbTiO3) as a main component, a process for forming a cylindrical body by superimposing the first and second piezoelectric elements such that the surface having an electrode of the first piezoelectric element confronts the surface without an electrode of the second piezoelectric element, and wrapping these elements around a shaft to form a cylindrical body, a process for burning the formed cylindrical body at a predetermined temperature, and a process for polarizing the burned cylindrical body by applying a predetermined voltage between the electrodes.

These and other objects, advantages and features of the invention will become apparent from the following description thereof taken in conjunction with the accompanying drawings which illustrate specific embodiments of the invention.

BRIEF DESCRIPTION OF THE DRAWINGS

In the following description, like parts are designated by like reference numbers throughout the several drawings.

FIG. 11 is a perspective view showing the process for manufacturing disk-like element for forming the shaft of a fourth embodiment;

FIG. 12 is a perspective view showing the process for manufacturing the shaft;

FIG. 14 is a perspective view showing the construction of the shaft of a piezoelectric element of a fifth embodiment;

FIG. 15 is a cross section view of the piezoelectric element of the fifth embodiment with the shaft removed; and ,FIG. 16 is a perspective view showing the construction of the shaft of a piezoelectric element of a sixth embodiment.

DESCRIPTION OF THE PREFERRED EMBODIMENTS

The preferred embodiments of the present invention are described hereinafter.

First Embodiment

Figure 1:
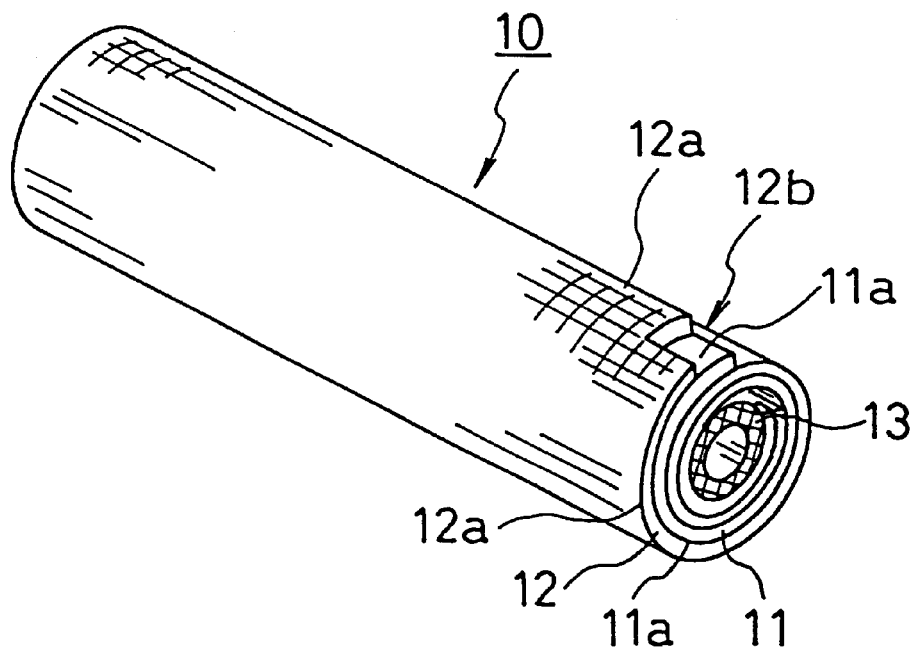
FIG. 1 is a perspective view of the exterior of a piezoelectric element of a first embodiment.
Figure 2:
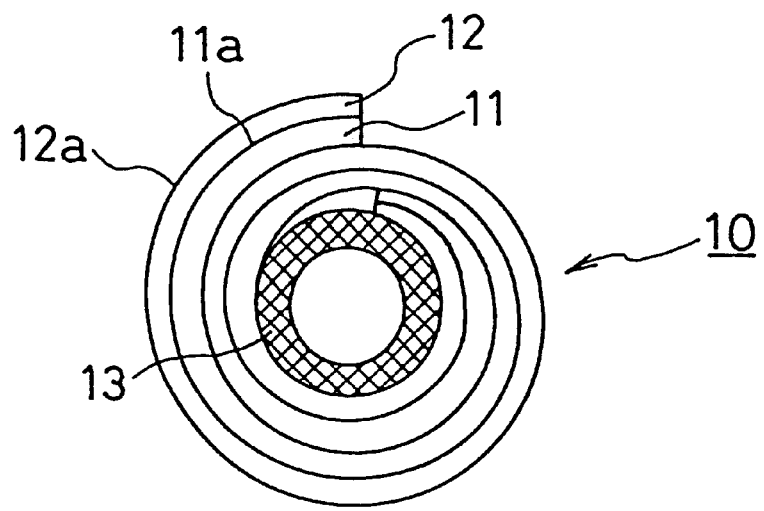
FIG. 2 is a cross section view of the piezoelectric element of FIG. 1.
Figure 3:
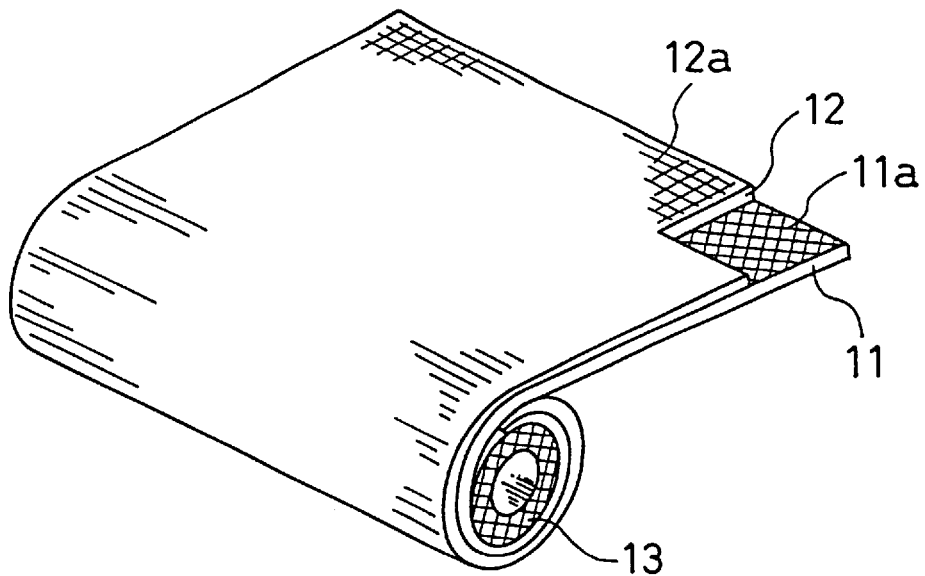
FIG. 3 is a perspective view the process for manufacturing the piezoelectric element of FIG. 1.
Figure 4:
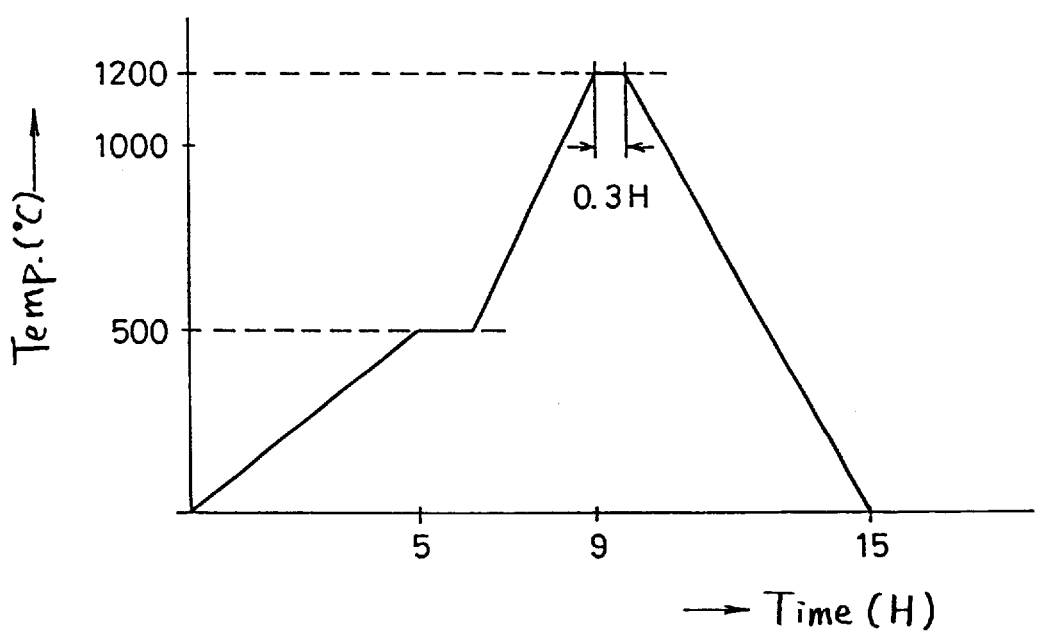
FIG. 4 shows an example of the burning temperature condition of the piezoelectric element.

FIGS. 1 through 3 illustrate the construction and manufacturing process of the piezoelectric element of a first embodiment; FIG. 1 is a perspective view showing the exterior of the piezoelectric element; FIG. 2 is a cross section view of the piezoelectric element of FIG. 1; and FIG. 3 is a perspective view showing the process for manufacturing the piezoelectric element.

As shown in FIGS. 1 and 2, a piezoelectric element 10 comprises thin sheet-like first piezoelectric element 11 and second piezoelectric element 12 respectively provided with an electrode 11a and an electrode 12a on the surface thereof, wherein the first piezoelectric element 11 and the second piezoelectric element 12 are superimposed one on another such that the non-electrode surface of the second piezoelectric element 12 confronts the electrode surface of the first piezoelectric element 11, and this laminate body is wrapped around a shaft 13 to form a cylindrical body.

Although the space between the shaft and the wrapped piezoelectric element ends is empty in FIG. 2, this empty space is due to the enlargement of the thickness of the piezoelectric element for purposes of this description, and actually there is virtually no empty space between the shaft and the wrapped piezoelectric element ends because the piezoelectric element is an extremely thin plate as described later.

As shown in FIG. 1, a notch 12b is formed on the end of the second piezoelectric element 12 positioned on the top side in order to expose the end of the electrode 11a of the first piezoelectric element 11 positioned on the bottom side when the first piezoelectric element 11 and the second piezoelectric element 12 are superimposed one upon another, to allow a lead to be connected to the electrode 11a of the bottom side element 11.

The process for manufacturing this piezoelectric element is described below. First, a piezoelectric ceramic having PZT (PbZrO3.PbTiO3) as a main component is used as the material for the piezoelectric elements 11 and 12. The ceramic powder is mixed with solvent, dispersion agent, binder, plasticizer and the like, and spread to form a uniformly flat surface of uniform thickness using a blade or the like, and stretched to a thickness of, for example, 20~100 μm. The solvent is evaporated to dry the material, and obtain a flexible sheet referred to as a "green sheet."

Small quantities of atoms such as Sr, Sn, Sb, Mn and the like may be added to the PZT as a modifier.

A paste-like electrode material, e.g., Pt, Ag—Pd electrode material, is printed on the surface of the green sheet (piezoelectric element) via a means such as screen printing or the like to a thickness of 1 to several microns to form the electrodes 11a and 12a.

The piezoelectric element bearing the printed electrode is cut to a predetermined size, and superimposed and glued such that the second piezoelectric element 12 bearing the electrode 12a is superimposed on the first piezoelectric element 11 bearing the electrode 11a. At this time, the non-electrode surface of the second piezoelectric element 12 confronts the electrode surface of the first piezoelectric element 11. A notch 12b is formed beforehand in the corner of the second piezoelectric element 12.

Then, as shown in FIG. 3, a cylinder is prepared of a burned (sintering) piezoelectric ceramic, e.g., a piezoelectric ceramic having PZT as a main component, and using this cylinder as a shaft 13, the previously laminated sheets of the piezoelectric elements 11 and 12 are wrapped about the shaft 13 to form a cylindrical body.

Then, this cylindrical body is burned under predetermined temperature conditions, leads are connected to the electrodes 11a and 12a, and when the piezoelectric elements 11 and 12 are polarized by applying a predetermined direct current high voltage, the piezoelectric element 10 is complete.

The temperature conditions for burning includes, for example, gradually increasing the temperature to 500° C. over about 5 hr, and after burning at 500° C. for a uniform time, gradually increasing the temperature to 1200° C. 9 hr after the start. After burning for about 0.3 hr at 1200° C., the material is cooled to room temperature over a period of about 6 hr.

The direction of polarization is the thickness direction of the sheet like piezoelectric element, and polarization is accomplished, for example, by applying a voltage of 1.5 kV/mm between the electrodes 11a and 12a in an environment of 60° C. for twenty minutes. The shaft 13 is not limited to a piezoelectric ceramic cylinder, inasmuch as a cylinder of another ceramic may be used, or a cylinder of a high melting point material such as carbon, molybdenum, tungsten or the like may be used.

The construction of the actuator using the aforesaid piezoelectric element is described below with reference to FIGS. 5, 6, and 7.

Figure 5:
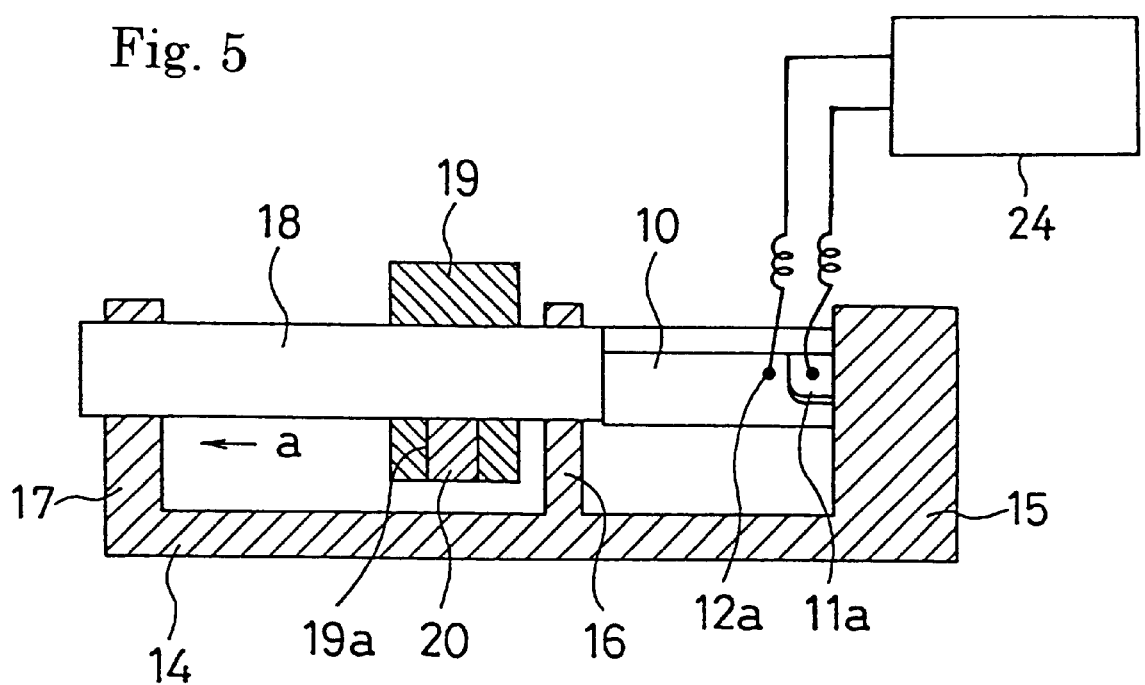
FIG. 5 is a cross section view showing the construction of an actuator using the piezoelectric element.

FIG. 5 is a cross section view showing the construction of the piezoelectric element. In FIG. 5, reference number 14 refers to a base, and reference numbers 15, 16, and 17 refers to support blocks, reference number 18 refers to a drive shaft is supported by the support block 16 and the support block 17 so as to be freely movable and displaceable in the axial direction (arrow a direction and the opposite direction) via the displacement in the axial direction generated by the piezoelectric element 10.

Reference number 10 refers to the cylindrical piezoelectric element manufactured by the aforesaid manufacturing process. One end of the piezoelectric element 10 is fixedly attached to the support block 15, and the other end is fixedly attached to the drive shaft 18.

Reference number 24 refers to a drive pulse generating circuit for generating a sawtooth wave pulse having a moderate rising part and a rapid falling part, or a rapid rising part and a moderate falling part; the drive pulse generating circuit 24 drives the piezoelectric element 10 by supplying drive pulses between the electrodes 11a and 12a of the piezoelectric element 10.

Figure 6:
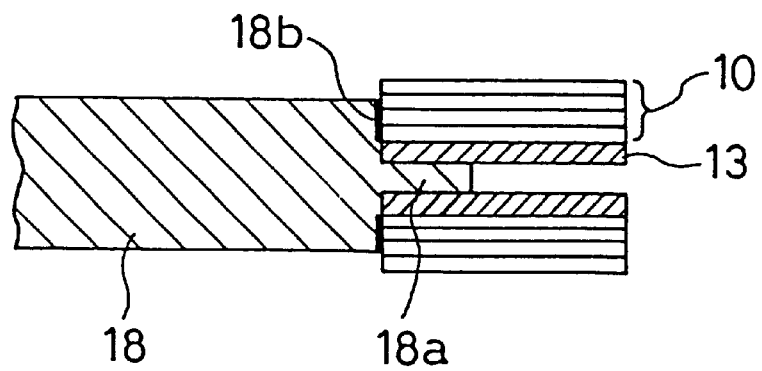
FIG. 6 is a cross section view showing the construction of the connecting part of the piezoelectric element and the drive shaft.
Figure 7:
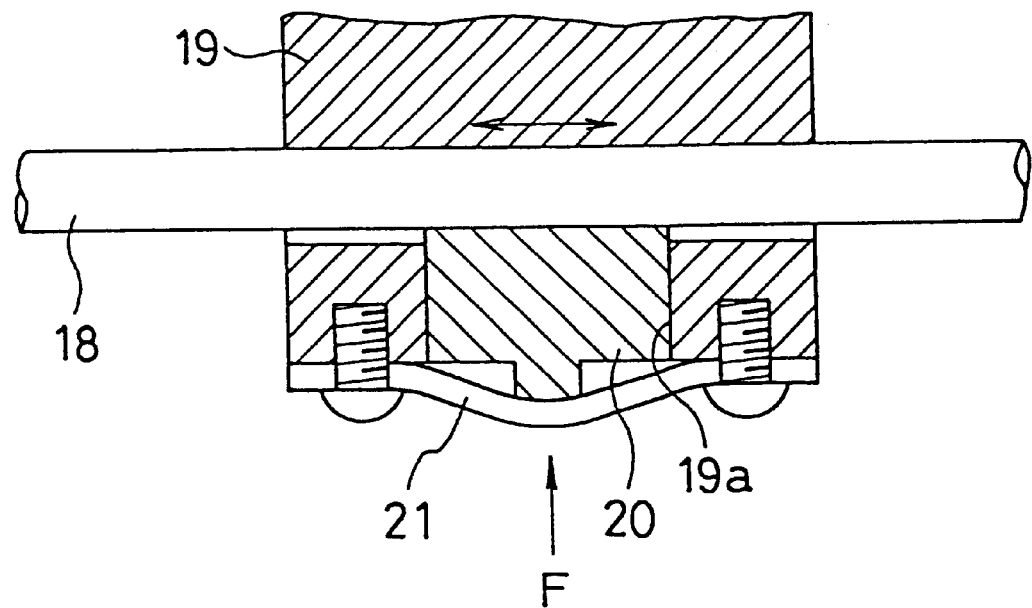
FIG. 7 is a cross section view showing the construction of the friction connector between the drive shaft and the slider of the actuator.

FIG. 6 is a cross section view showing the construction of the connection between the piezoelectric element 10 and the drive shaft 18. As shown in the drawing, a thin diameter part 18a in the center of the drive shaft 18 meshes with the interior side of the shaft 13, and the endface of the drive shaft 18 and the endface of the piezoelectric element 10 are bonded with an adhesive 18b. According to this construction, the drive shaft 18 and the piezoelectric element 10 can be bonded while being accurately positions via the shaft 13, thereby increasing operation efficiency.

Reference number 19 refers to a slider, and this slider and the drive shaft 18 are friction bonded with a suitable friction force. FIG. 7 is a cross section view showing the construction of the friction connection between the slider 19 and the drive shaft 18; the drive shaft 18 passes through the slider 19, and an aperture 19a is formed below the area if the slider 19 which the drive shaft 18 passes through, thereby exposing the bottom half of the drive shaft 18. A pad 20 is inserted in the aperture 19a so as to contact the bottom half of the drive shaft 18, and this pad 20 is pushed upward via a flat spring 21 such that a pressure is applied to the drive shaft 18, the slider 19 and the pad 20 via the force F of the flat spring 21, thus achieving a friction bond with a suitable friction force. A drive member such as a table or the like not shown in the drawing is connected to the slider 19.

The operation of the piezoelectric element is described below. When the electrodes 11a and 12a of the piezoelectric element 10 are connected to the drive pulse generating circuit 24 and a sawtooth wave drive pulse of several tens of kilohertz is applied between the electrodes 11a and 12a, a reciprocating movement is generated at different speeds in the axial direction of the drive shaft 18 connected to the piezoelectric element because an expansion/contraction displacement is generated in the axial direction of the piezoelectric element 10. In this way, the slider 19 friction bonded to the drive shaft 18 slides on the drive shaft 18 so as to move in the oscillation direction of the slower speed due to the asymmetry of the reciprocating movement of the drive shaft, and the driven member such as a table or the like connected to the slider is moved.

This piezoelectric element is constructed by forming electrodes on the surface of a piezoelectric element made of a piezoelectric ceramic material having PZT as a main component, and wrapping the thin sheets of the first piezoelectric element and a second piezoelectric element around a shaft to form a cylinder. When experiments were conducted to verify whether or not the presence of the shaft influenced the amount of displacement generated in the piezoelectric element, the influence of the shaft was found to be slight. It was also verified that as hollow shaft affected displacement less than a solid shaft.

When the piezoelectric elements were laminated and formed in a cylinder, it can be wrapped without slack by wrapping around a shaft, thereby making automation of the wrapping operation quite easy.

When a burned piezoelectric ceramic is used as a shaft, the piezoelectric laminate body can be formed in a cylinder without looseness because the shrinkage generated in the piezoelectric element by burning can be used for wrap tightening. When a shaft is not used in the burning operation, it was verified that distortion is generated in the burned piezoelectric element due to the shrinkage generated in the piezoelectric element, and the wrapped laminate body loosened and deformed.

Although the shaft may be formed of a material which vaporizes at less than 1000° C. in addition to the cylinder of high melting point material such as the burned piezoelectric ceramic, carbon, tungsten, molybdenum and the like, there is a possibility of deformation due to the pressure of vaporization depending on the selection of the material. Fiber materials present in the natural world are suitable for use as the material which vaporizes at less than 1000° C.

Second Embodiment

In the second embodiment, when forming the electrodes on the surface of the green sheets of the piezoelectric ceramic material of the first embodiment, the electrodes are formed so as to produce an electrodeless insulated area oat the bilateral ends in the axial direction of the cylindrical body of the finished shape of the piezoelectric element.

Figure 8:
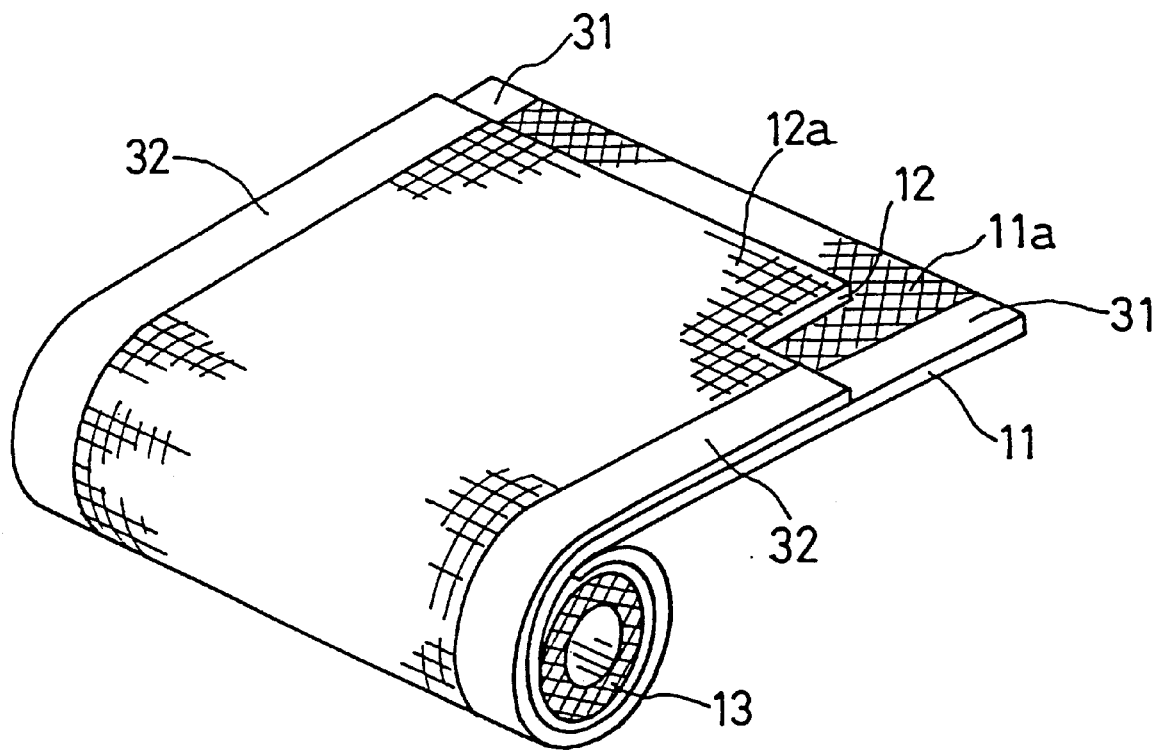
FIG. 8 is a perspective view showing the construction of a piezoelectric element of a second embodiment.

FIG. 8 is a perspective view showing the construction of the piezoelectric element of the second embodiment; parts common to the first embodiment are designated by like reference numbers. In FIG. 8, an electrode 11a and an electrode 12a are respectively formed on surface of the first piezoelectric element 11 and the second piezoelectric element 12. When the sheet is wrapped to form a cylindrical member, the electrodes 11a and 12a are formed so as to form the insulated areas 31 and 32 lacking electrodes on the bilateral ends in the axial direction of the cylindrical member.

Then, the first piezoelectric element 11 and the second piezoelectric element 12 bearing the electrodes are superimposed such that the non-electrode surface of the second piezoelectric element 12 confronts the electrode surface of the first piezoelectric element 11, and this laminate body is wrapped around a shaft 13 to form a cylinder which is burned under predetermined temperature conditions, leads are connected to the electrodes 11a and 12a, and the piezoelectric elements are polarized by applying a predetermined DC high voltage to complete the piezoelectric element 10. These processes are identical to those of the piezoelectric element of the previously described first embodiment.

The material used to form the piezoelectric element may be a piezoelectric ceramic having PZT (PbZrO3.PbTiO3) as a main component identical to the material of the first embodiment.

The piezoelectric element of this construction eliminates concern of shorting of the electrodes because the electrodes are not exposed at the ends of the cylinder of the cylindrical piezoelectric element, and does not require processes such as the formation of the insulated area by application of an insulation material on the ends to prevent electrode shorting.

Third Electrode

The third embodiment provides electrodes formed on both surfaces of a piezoelectric element formed of piezoelectric ceramic material, and overlaying this piezoelectric element on an insulating sheet and wrapping both around a shaft to form a cylinder.

Figure 9:
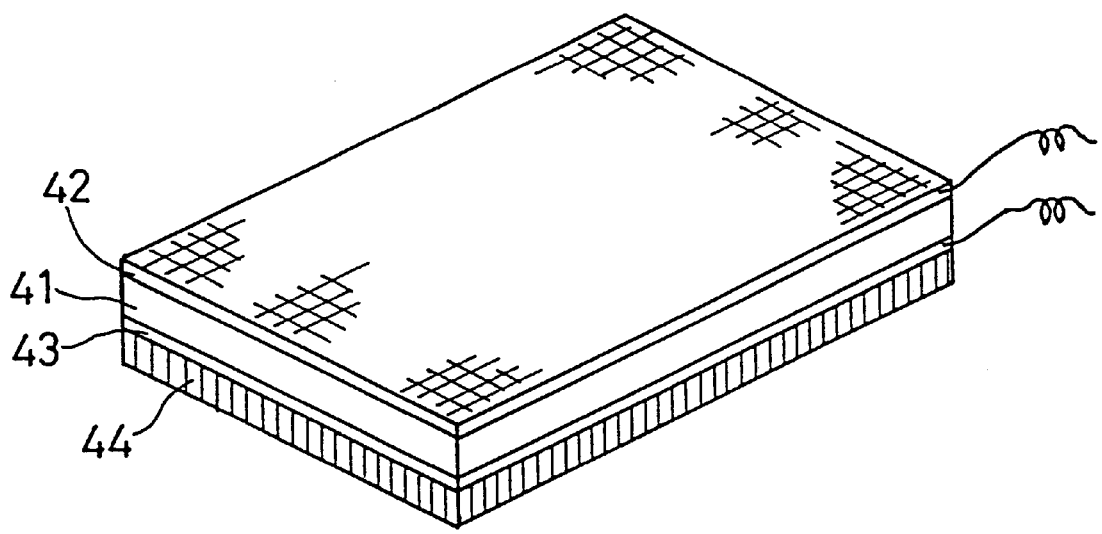
FIG. 9 is a perspective view prior to forming the cylindrical piezoelectric element of a third embodiment.
Figure 10:
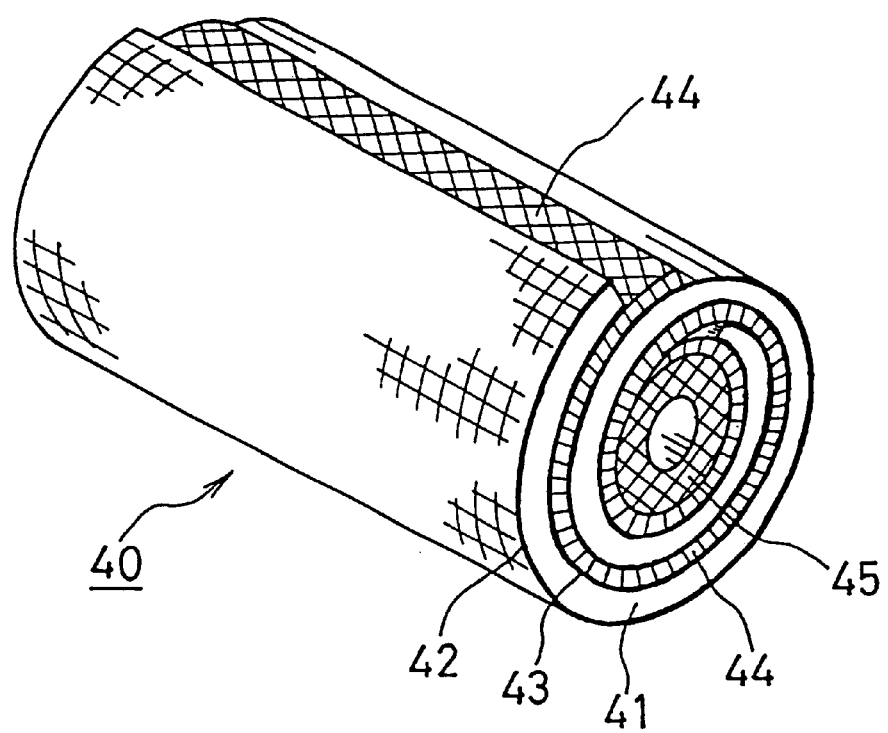
FIG. 10 is a perspective view showing the piezoelectric element of the third embodiment formed as a cylinder.

FIGS. 9 and 10 show the construction of the piezoelectric element of the third embodiment; FIG. 9 is a perspective view of the element prior to forming the cylinder, and FIG. 10 is a perspective view showing the piezoelectric element wrapped around a shaft to form a cylinder. In FIGS. 9 and 10, reference number 41 refers to a piezoelectric element formed of a piezoelectric ceramic material, and reference numbers 42 and 43 refer to the electrodes formed on the front surface and the back surface of the piezoelectric element 41. Reference number 44 refers to the insulation sheet, and reference number 45 refers to the shaft.

The process for manufacturing this piezoelectric element is described below. First, similar to the first embodiment, a piezoelectric ceramic powder having PZT ($PbZrO_3.PbTiO_3$) as a main component is mixed with solvent, dispersion agent, binder, plasticizer and the like, and spread to form a uniformly flat surface of uniform thickness using a blade or the like, and stretched to a thickness of, for example, 20~100 $\mu$m. The solvent is evaporated to dry the material, and obtain a flexible sheet referred to as a "green sheet." A paste-like electrode material, e.g., Pt, Ag—Pd electrode material, is printed on the front and back surfaces of the green sheet (piezoelectric element) via a means such as screen printing or the like to a thickness of 1 to several microns to form the electrodes 42 and 43.

The piezoelectric element bearing the printed electrodes 42 and 43 is cut to a predetermined size, and the insulation sheet 44 is arranged and overlaid on the bottom side of the electrode 43 on the back surface. Then, a cylinder is prepared of a burned piezoelectric ceramic, e.g., a piezoelectric ceramic having PZT as a main component, and using this cylinder as a shaft 45, the piezoelectric element 41 and the overlaid insulation sheet 44 are wrapped as a unit around the shaft 45 so as to form a cylindrical body.

Then, this cylindrical body is burned under predetermined temperature conditions, leads are connected to the electrodes 42 and 43, and the piezoelectric element is polarized by applying a predetermined direct current high voltage, to produce the finished piezoelectric element 40 is complete.

The piezoelectric element of the third embodiment does not require two green sheets comprising electrodes formed on the front and back surfaces of the piezoelectric element 41, thereby simplifying the processing.

Fourth Embodiment

The fourth embodiment differs in the construction of the shaft in the piezoelectric element of the previously described first embodiment, and, therefore, the salient points in the construction of the shaft are described below.

The shaft 13' is formed by burning a cylinder formed of piezoelectric ceramic material having PZT ($PbZrO_3.PbTiO_3$) as a main component, slicing this cylinder a dicing saw or the like into thin plates having a thickness t (e.g., about 1 mm), and forming a disk-like plate 13P having a hole in the center. These disk-like plates 13P are then inserted on a working shaft 51 having an external diameter approximately equal to the internal diameter of the center of the disk-like plate 13P, so as to be stacked. FIG. 12 shows the stacked state.

Then, tape or the like is wrapped around the exterior side of the stacked disk-like plates to lock them in place, the working shaft 51 is removed, and an adhesive such as a cyanoacrylate adhesive, is poured onto the interior surface to mutually adhere the disk-like plates 13P to form a cylinder, after which the tape is removed to complete the shaft 13'.

When the sheet-like piezoelectric elements 11 and 12 are wrapped around the shaft 13' and burned, the adhesive mutually adhering the disk-like plates 13P forming the shaft 13' is thermally decomposed by the burning process, and the disk-like plates 13P separate in the displacement direction of the piezoelectric element 10, such that the displacement generated by the piezoelectric element 10 is not impaired regardless of the presence of the shaft 13' in the interior of the piezoelectric element 10.

The shaft 13' is not limited to a piezoelectric ceramic cylinder, inasmuch as a cylinder of another ceramic may be used, or a cylinder of a high melting point material such as carbon, molybdenum, tungsten or the like may be used. Furthermore, the shape is not restricted to a cylinder, and a circular column or other suitable shape may be used.

Figure 13:
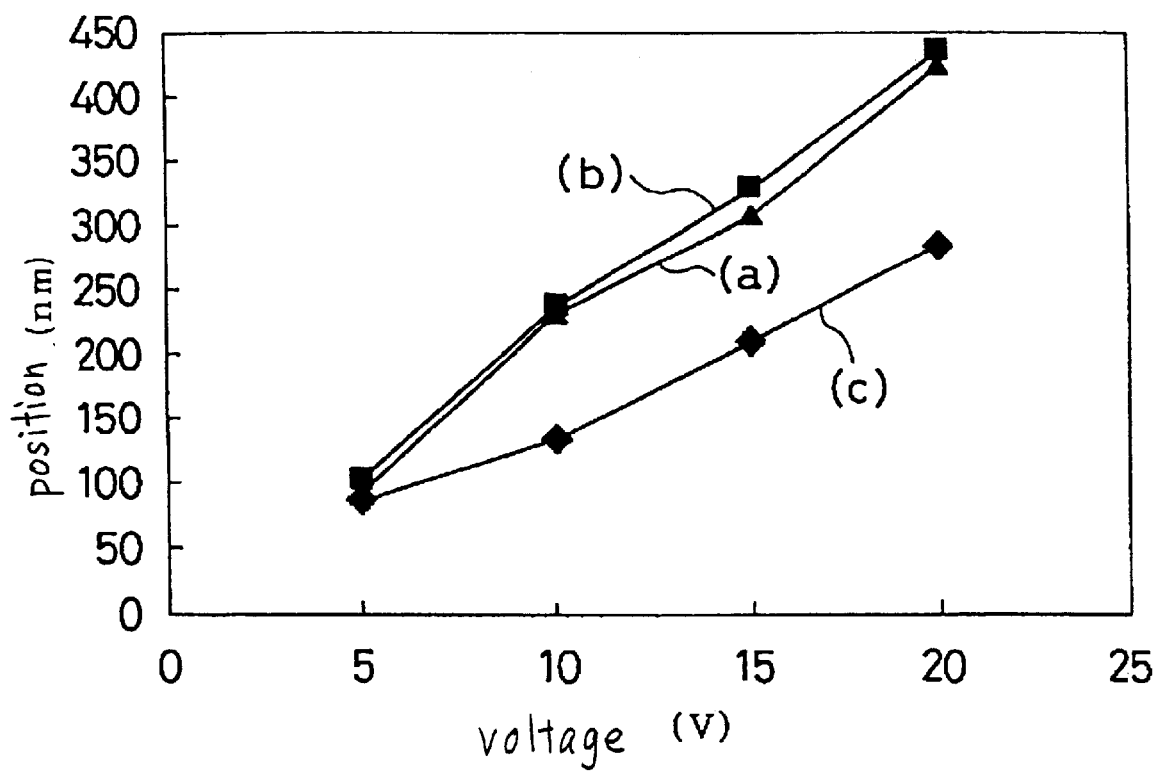
FIG. 13 illustrates the relationship between the displacement and the voltage applied to a piezoelectric element having a normal shaft, a piezoelectric element having a shaft separated in the direction of displacement, and a piezoelectric element without a shaft.

FIG. 13 illustrates the relationship between displacement and the applied voltage relative to a piezoelectric element (a) having a shaft separated in the displacement direction of the piezoelectric element of the fourth embodiment, a shaftless piezoelectric element (b), and the piezoelectric element (c) of the first embodiment.

As can be understood from the chart, the relationship between the applied voltage and the displacement of the piezoelectric element (a) having a shaft separated in the displacement direction of the piezoelectric element of the fourth embodiment is extremely near the relationship of the shaftless piezoelectric element (b), and displacement loss is suppressed to a maximum of 11% compared to the shaftless piezoelectric element (b).

In contrast, the piezoelectric element (c) of the first embodiment has a maximum displacement loss of 34% compared to the shaftless piezoelectric element (b).

The shaftless piezoelectric element is subject to large deformation during burning, and there is a distinct possibility that the laminate layer will peel from the laminated sheet-like piezoelectric element, whereas the piezoelectric element having a shaft separated in the direction of displacement and the piezoelectric element having a normal shaft have only slight deformation during burning, and there is only a slight possibility of peeling of the laminate layer of the laminated piezoelectric element.

Regarding the strength (ease of fracture) of the cylindrical piezoelectric element in the radius direction, the piezoelectric element having a shaft separated in the displacement direction and the piezoelectric element having a normal shaft are more less likely to crack than the shaftless piezoelectric element. The ease of the operation of wrapping the laminate piezoelectric element in a cylindrical shape during manufacture is made much easier when a shaft is used.

In the piezoelectric element of the fourth embodiment, after burning, the shaft is separated such that the separated shaft may be removed.

Fifth Embodiment

The fifth embodiment is similar to the previously described piezoelectric element of the first embodiment, and comprises thin sheet first piezoelectric element 11 and second piezoelectric element 12 provided with electrodes 11a and 12a on the respective surfaces thereof, and superimposed such that the non-electrode surface of the second piezoelectric element 12 confronts the electrode surface of the first piezoelectric element 11 (refer to FIGS. 1~3), and this laminate body is wrapped around the shaft of the fifth embodiment to form a cylinder, which is burned, and thereafter the shaft is removed. In this embodiment, the construction of the shaft differs from the construction of the shaft of the fourth embodiment but in other respects is similar, and for this reason only the construction of the shaft is described.

FIGS. 14 and 15 show the construction of the shaft of the piezoelectric element of the fifth embodiment; FIG. 14 is a perspective view showing the construction of the shaft 55, and FIG. 15 is a cross section view showing the shaft 55 removed from the piezoelectric element cylinder body formed by wrapping the thin sheets of the first piezoelectric element 11 and the second piezoelectric element 12 around the shaft 55.

The shaft 55 is formed, for example, by burning a piezoelectric ceramic cylinder having PZT as a main component, and slicing this cylinder parallel to the axial direction, i.e., along the direction of displacement of the piezoelectric element, as shown in FIG. 14, into a plurality of segments 55a, 55b, 55c, 55d, 55e, 55f, 55g, 55h using a dicing saw or the like. Then, these segments 55a~55h are adhered using, for example a cyanoacrylate adhesive, to again form a cylinder.

The laminated sheet piezoelectric elements 11 and 12 (refer to FIG. 3) are wrapped around this shaft 55 to form a cylinder, the cylinder is burned under predetermined temperature conditions, leads are connected to the electrodes 11a and 12a, and the piezoelectric elements are polarized by the application of a predetermined DC high voltage.

The adhesive adhering the segments 55a~55h comprising the shaft 55 is thermally decomposed during the burning process, and the segments 55a through 55h become separated so as to be readily removable from the piezoelectric element cylindrical body formed by the wrapped piezoelectric elements 11 and 12, thereby producing a shaftless piezoelectric element.

The shaft 55 is not limited to a piezoelectric ceramic cylinder, inasmuch as a cylinder of another ceramic may be used, or a cylinder of a high melting point material such as carbon, molybdenum, tungsten or the like may be used. Furthermore, the shape is not restricted to a cylinder, and a circular column or other suitable shape may be used.

Sixth Embodiment

The sixth embodiment is similar to the previously described piezoelectric element of the fifth embodiment, and comprises thin sheet first piezoelectric element 11 and second piezoelectric element 12 provided with electrodes 11a and 12a on the respective surfaces thereof, and superimposed such that the non-electrode surface of the second piezoelectric element 12 confronts the electrode surface of the first piezoelectric element 11 (refer to FIGS. 1~3), and this laminate body is wrapped around the shaft of the fifth embodiment to form a cylinder, which is burned, and thereafter the shaft is removed. In this embodiment, the construction of the shaft differs but in other respects is similar, and for this reason only the construction of the shaft is described.

Figure 16:
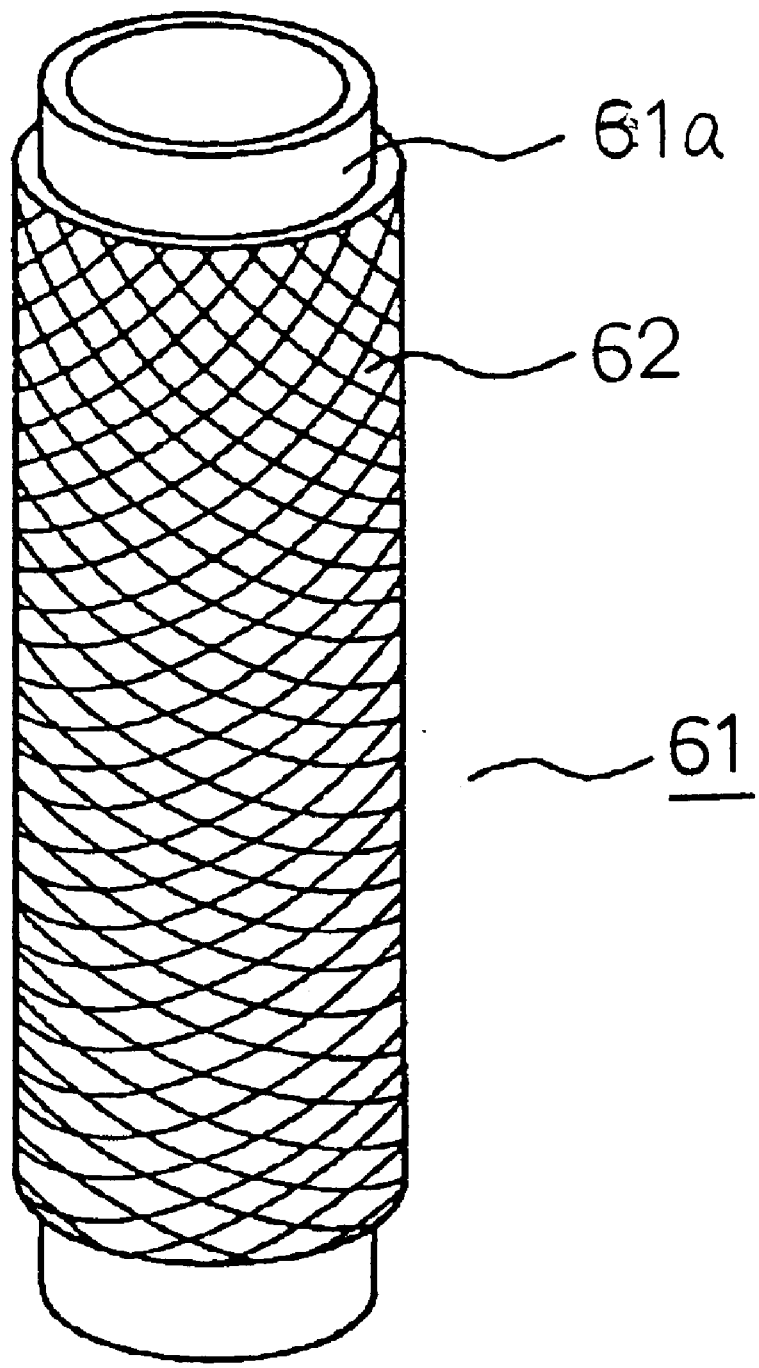

FIG. 16 shows the construction of the shaft of the piezoelectric element of the sixth embodiment; the shaft 61 comprises a core shaft 61a the surface of which is coated with a coating agent formed of a thermally decomposing material to form a protective layer 62.

The laminate sheet piezoelectric elements 11 and 12 (refer to FIG. 3) are wrapped around the shaft 61 formed with a protective layer 62 via an application of a coating agent so as to form a cylindrical body, this cylindrical body is burned under predetermined temperature conditions, leads are connected to the electrodes 11a and 12a, and the piezoelectric elements are polarized by the application of a predetermined DC high voltage.

The protective layer 62 formed of a coating agent on the surface of the shaft 61 is vaporized by thermal decomposition, so as to produce a gap between the core shaft 61a and the piezoelectric cylindrical body comprising the wrapped piezoelectric elements 11 and 12, such that the core shaft 61a, i.e., the shaft 61 without the protective layer 62 of the coating agent, to be easily removed, to produce a shaftless piezoelectric element. The coating agent is selected from among materials which thermally decompose at a temperature below a value as near as possible to the burning temperature.

The core shaft is not limited to a piezoelectric ceramic cylinder, inasmuch as a cylinder of another ceramic may be used, or a cylinder of a high melting point material such as carbon, molybdenum, tungsten or the like may be used. Furthermore, the shape is not restricted to a cylinder, and a circular column or other suitable shape may be used.

The actuators using the piezoelectric elements of the second, third, fourth, fifth, and sixth embodiments are identical in construction to the actuator using the piezoelectric element of the first embodiment and are therefore not described further.

Although preferred embodiments of the invention have been described in the foregoing detailed description and illustrated in the accompanying drawings, it will be understood that the invention is not limited to the embodiments disclosed, but is capable of numerous rearrangements, modifications and substitutions of parts and elements without departing from the spirit of the invention. Accordingly, the present invention is intended to encompass such rearrangements, modification and substitutions of parts and elements as fall within the spirit and scope of the invention.

What is claimed is:

1. A piezoelectric element for generating driving force comprising:

a shaft; and a thin Piezoelectric sheet with electrodes formed on the surfaces thereof, said thin piezoelectric sheet being wrapped around the shaft, wherein said piezoelectric sheet generates a driving force in a longitudinal direction of said shaft when a driving signal applied to said electrodes.

2. A piezoelectric element according to claim 1, wherein said thin piezoelectric sheet is formed of a piezoelectric ceramic having PZT (PbZrO3.PbTiO3) as a main component.

3. A piezoelectric element according to claim 1, wherein said thin piezoelectric sheet is constructed by first sheet and second sheet laminated to the first sheet, the first and second sheets having an electrode formed on one surface, respectively.

4. A piezoelectric element according to claim 1, wherein said shaft is a hollow shaft.

5. A piezoelectric element according to claim 1, wherein said shaft is a solid shaft.

6. A piezoelectric element according to claim 1, wherein said shaft is formed of the same material as said thin piezoelectric sheet.

7. A piezoelectric element according to claim 1, wherein said shaft is formed by a high melting point material.

8. A piezoelectric element according to claim 1, wherein said shaft is constructed by adhering a plurality of members via an adhesive.

9. A piezoelectric element according to claim 8, wherein said adhesive thermally decomposes at a temperature below the burning temperature of the piezoelectric element.

10. A piezoelectric element according to claim 8, wherein said plurality of members comprising the shaft is a plurality of individual disk-shaped plates separated relative to the displacement direction of the piezoelectric element.

11. A piezoelectric element according to claim 8, wherein said plurality of members comprising the shaft is a plurality of individual cylindrical or circular column-like segments separated relative to the displacement direction of the piezoelectric element.

12. A piezoelectric element according to claim 1, wherein said shaft has a coating of a high melting point material, the coating thermally decomposes at a temperature below the burning temperature of the piezoelectric element.

13. A piezoelectric element according to claim 1, wherein the thin piezoelectric sheet is polarized in a thickness direction thereof.

14. An actuator comprising:
- a piezoelectric element having a shaft and a thin piezoelectric sheet with electrodes formed on the surfaces thereof, said thin piezoelectric sheet being wrapped around the shaft;
- a drive shaft secured to said piezoelectric element; and
- a driven member frictionally coupled to said drive shaft.

* * * * *